United States Patent
Fujiwara et al.

(10) Patent No.: US 6,354,825 B1
(45) Date of Patent: Mar. 12, 2002

(54) HELICAL BLADE FLUID COMPRESSOR HAVING AN ALUMINUM ALLOY ROTATING MEMBER

(75) Inventors: Takayoshi Fujiwara, Hino; Masayuki Okuda; Takashi Honjo, both of Kawasaki; Takuya Hirayama, Fujisawa; Tetsuo Fukuda, Yokohama; Shinobu Sato, Yokohama; Yoshinori Sone, Yokohama; Moriaki Shimoda, Yokohama; Shigeo Kida, Kamakura; Satoshi Oyama, Hiratsuka, all of (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/679,387

(22) Filed: Oct. 5, 2000

Related U.S. Application Data (62) Division of application No. 09/319,039, filed as application No. PCT/JP98/04046 on Sep. 9, 1998, now abandoned.

(30) Foreign Application Priority Data

Sep. 30, 1997 (JP) .............................................. 9-265879

(51) Int. Cl.$^7$ .............................................. F04C 18/22
(52) U.S. Cl. ........................ 418/220; 418/178; 418/179
(58) Field of Search ................................ 418/178, 179, 418/220

(56) References Cited

U.S. PATENT DOCUMENTS

| 4,560,332 A | 12/1985 | Yokoyama et al. ............ 418/83 |
| 4,640,125 A | * 2/1987 | Carpenter .................... 418/178 |
| 5,314,321 A | * 5/1994 | Yamamoto et al. .......... 418/178 |
| 5,368,457 A | 11/1994 | Wantanabe et al. .......... 418/220 |
| 5,573,390 A | * 11/1996 | Takeuchi et al. ............. 418/178 |

FOREIGN PATENT DOCUMENTS

| EP | 464 683 | 1/1992 | |
| JP | 3-145592 | 6/1991 | |
| JP | 4-76294 | 3/1992 | ................. 418/220 |
| JP | 4-76295 | * 3/1992 | ................. 418/220 |
| JP | 4-76296 | 3/1992 | ................. 418/152 |
| JP | 4-76297 | 3/1992 | |
| JP | 8-276451 | 10/1996 | |

OTHER PUBLICATIONS

Database WPI Section PQ, Week 9747 Derwent Publication Ltd., London, GB; Class 056. AN 97–510080 XP002098706 & JP 09 0242681 A (Toshiba KK) Sep. 16, 1997.
Patent Abstracts of Japan vol. 13, No. 469 (M–883) 3817, Oct. 24, 1989 & JP 01 182592 A (Diesel Kiki), Jul. 20, 1989.
Patent Abstracts of Japan vol. 15, No. 61 (M–1081), Feb. 13, 1991 & JP 02 291491 A (Toshiba Corp.) Dec. 3, 1990.

* cited by examiner

Primary Examiner—John J. Vrablik
(74) Attorney, Agent, or Firm—Pillsbury Winthrop

(57) ABSTRACT

A fluid compressor comprising a helical blade type compression mechanism that includes a cylinder, a roller arranged inside the cylinder and a helical blade interposed between the roller and the cylinder. The blade, the roller and the cylinder are formed of materials whose coefficients of thermal expansion satisfy relationships:

Blade>Roller>Cylinder.

According to this invention, pressure release can be easily performed in the case where the liquid flows back or under a low-temperature condition as at the time of actuation. In addition, the compression performance can be improved under a high-temperature condition during operation.

14 Claims, 8 Drawing Sheets

FIG. 11A MEASUREMENT POSITION NO.1

FIG. 11B MEASUREMENT POSITION NO.9

FIG. 12A MEASUREMENT POSITION NO.1

FIG. 12B MEASUREMENT POSITION NO.9

HELICAL BLADE FLUID COMPRESSOR HAVING AN ALUMINUM ALLOY ROTATING MEMBER

This is a division of application Ser. No. 09/319,039, filed Jun. 1, 1999, now abandoned which is a 371 of PCT/JP98/04046 filed Sep. 9, 1998.

TECHNICAL FIELD

The present invention relates to a fluid compressor employed in a refrigeration cycle apparatus, having a helical blade type compression mechanism, and designed for compressing a refrigerant gas (i.e., a gas to be compressed).

BACKGROUND ART

In recent years, fluid compressors that are referred to as helical blade type compressors are proposed. In this type of compressor, a cylinder is arranged in a sealed case, and a roller serving as a rotating member is eccentrically arranged inside the cylinder. Inside the cylinder, the roller rotates on its own axis or revolves around a given axis.

A blade is interposed between the circumferential surface of the roller and the inner circumferential surface of the cylinders, and a plurality of compression chambers are defined by the blade. A refrigerant gas (i.e., a gas to be compressed in a refrigeration cycle) is sucked into the one-end region of the compression chambers. The refrigerant gas is compressed while gradually moving closer to the other-end region.

Unlike the conventional reciprocating or rotary type compressor, this type of compressor is very reliable in sealing characteristics in spite of its simple structure. In addition, it enables efficient compression and can be easily assembled by use of easily-manufactured parts.

Most of the parts constituting the compression section are formed of iron-based materials. Since the parts of the compression section slide with reference to each other, they are required to have reliable abrasion resistance. Normally, therefore, they are made of cast iron or sintered metal.

The parts jointly define a compression chamber and therefore has a function of sealing the gas. If they are formed of the same iron-based material, they have the same coefficient of thermal expansion, and the clearance between them remains unchanged without reference to changes in temperature. Therefore, the use of the same iron-based material enables the clearance to be as narrow as possible and contributes to improvement of the compression performance.

However, where the clearance between the parts is very narrow, the gas does not easily escape through it, when the pressure in the compression chamber rapidly rises as in the situation where the liquid flows backward. A pressure release mechanism has to be provided to cope with such a situation, but this results in a complex structure.

In this type of compressor, moreover, the relative circumferential speeds between the blade and the roller and between the roller and the bearing are comparatively low. Since these portions of the compressor are easily set in the boundary lubrication condition when the compressor is driven, the roller is mainly formed of an abrasion-resistant material which has a comparatively large specific gravity, just like cast iron. The use of such a material ensures enhanced reliability (improved abrasion resistant characteristics) even under the boundary lubrication condition.

However, the cast iron roller having a large specific gravity has a large inertia weight when the compressor is driven and is disadvantageous in light of the vibration suppression. It is therefore desirable that the roller be as light in weight as possible, so as to suppress both vibration and noise and therefore to improve the performance.

The blade described above is made of a fluoroplastic material, such as tetraethylene fluoride resin (hereinafter referred to as PTFE resin) or perfluoroalkoxy resin (hereinafter referred to as PFA resin), since the use of such a material is advantageous in light of the plasticity, the sealing characteristics, the sliding characteristics, and the environmental resistance (temperature, oil, and refrigerant).

In order to improve the abrasion resistance, a composite material is normally used for forming the blade. That is, inorganic fibers (e.g., glass fibers and carbon fibers), a solid lubricant and an organic filler are contained in the material of the blade.

Figure 13:
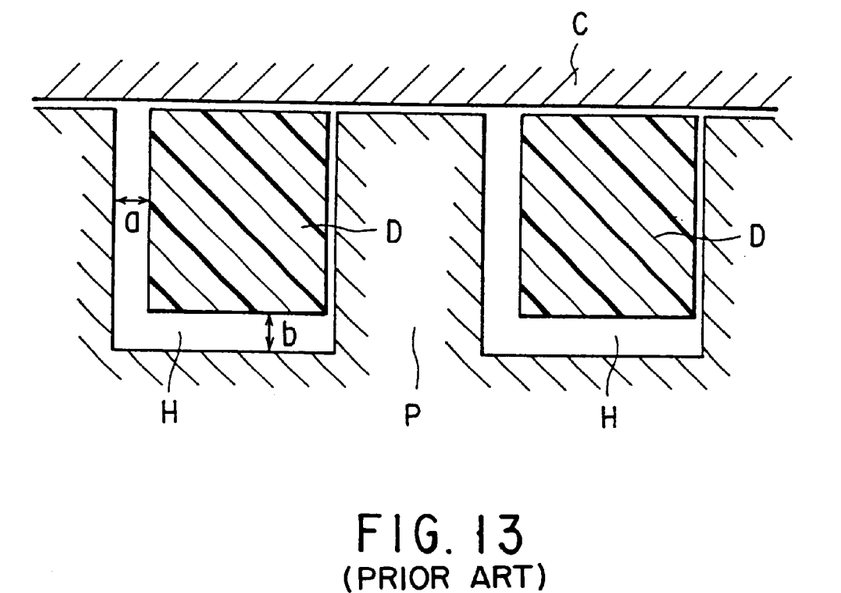
FIG. 13 shows how the clearances between the components of the conventional art.

Since a fluoroplastic material greatly varies in size when it thermally expands, clearances a and b defined between the blade D and the wall of the helical groove H, which is formed in the piston P arranged inside the cylinder C, are set to be minimum values when the temperature is highest (during operation of the compressor), in consideration of the compression efficiency and the size variation of the blade D due to the thermal expansion.

However, if the clearances are set or determined in this manner, they may be too large when a compression operation has just been started or in the other low-temperature situations. If this occurs, the sealing characteristics between the components are degraded, and an intended compression performance may not be attained.

Figure 14:
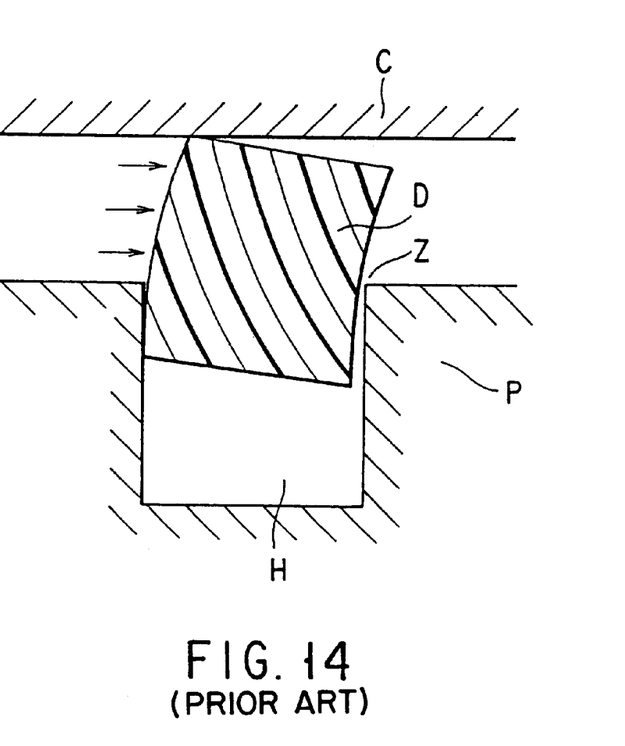
FIG. 14 shows a deformed state of the conventional blade.

It should be noted that the fluoroplastic blade D is soft and may easily bend due to the differential pressure. As shown in FIG. 14, moreover, the blade D may be rubbed at one side with the edge portion Z of the helical blade H. It should be also noted that the elastic modulus may decrease due to the thermal expansion, and the blade may be permanently deformed under an extremely high state of pressure.

SUMMARY OF THE INVENTION

The first object of the present invention is to provide a fluid compressor which enables pressure release to be easily done if the liquid flows back in the compressor or under a low-pressure condition as in the initial stage of operation, and which therefore enhances the compression performance under a high-temperature condition during operation.

The second object of the present invention is to provide a fluid compressor wherein the roller (a rotating member) is formed of a pre-selected material such that it is light in weight and highly improved in abrasion resistance and such that the vibration and noise are suppressed, and which is improved in compression performance.

The third object of the present invention is to provide a fluid compressor which suppresses the effects the thermal expansion and the pressure conditions may have on the helical blade by using a pre-selected material for forming the helical blade, and which is improved in compression performance.

The first object of the invention is realized by providing a fluid compressor that includes a helical blade type compression mechanism made up of a cylinder, a rotating member arranged inside the cylinder, and a helical blade interposed between the rotating member and the cylinder. The feature of the fluid compressor is that the cylinder, the rotating member and the cylinder are formed of materials such that their coefficients of thermal expansion satisfy the relationships: Blade>Rotating Member>Cylinder.

The second object of the invention is realized by providing a fluid compressor that includes a cylinder, a rotating member arranged inside the cylinder, and a helical blade interposed between the rotating member and the cylinder, the rotating member being formed of an aluminum alloy material.

The third object of the invention is realized by providing a fluid compressor that includes a cylinder, a rotating member arranged inside the cylinder, and a helical blade interposed between the rotating member and the cylinder. The blade is formed of a material selected from the group of a PEEK (polyether ether ketone) resin material, a PES (polyether sulfone) resin material, a PEI (polyether imide) resin material, a PAI (polyamide imide) resin material, a TPI (thermoplastic polyimide) resin material, an LCP (liquid crystal polymer such as every kind of aramotica polyester) resin material, and a PPS (polyphenylene sulfide) resin material.

According to the first invention, pressure release can be easily performed in the case where the liquid flows back or under a low-temperature condition as at the time of actuation. In addition, the compression performance can be improved under a high-temperature condition during operation.

According to the second invention, the roller (i.e., a rotating member) is formed of a pre-selected material, so that it is light in weight and highly improved in abrasion resistance. The vibration and noise are therefore reduced, and the compression performance is improved.

The third object of the present invention is to provide a fluid compressor which suppresses the effects the thermal expansion and the pressure conditions may have on the helical blade by using a pre-selected material for forming the helical blade, and which is improved in compression performance.

BEST MODE OF CARRYING OUT THE INVENTION

Embodiments of the invention will now be described with reference to the accompanying drawings.

The helical blade compressor disclosed herein is used, for example, in the refrigeration cycle of an air conditioner. The fluid to be compressed is a refrigerant gas.

Figure 1:
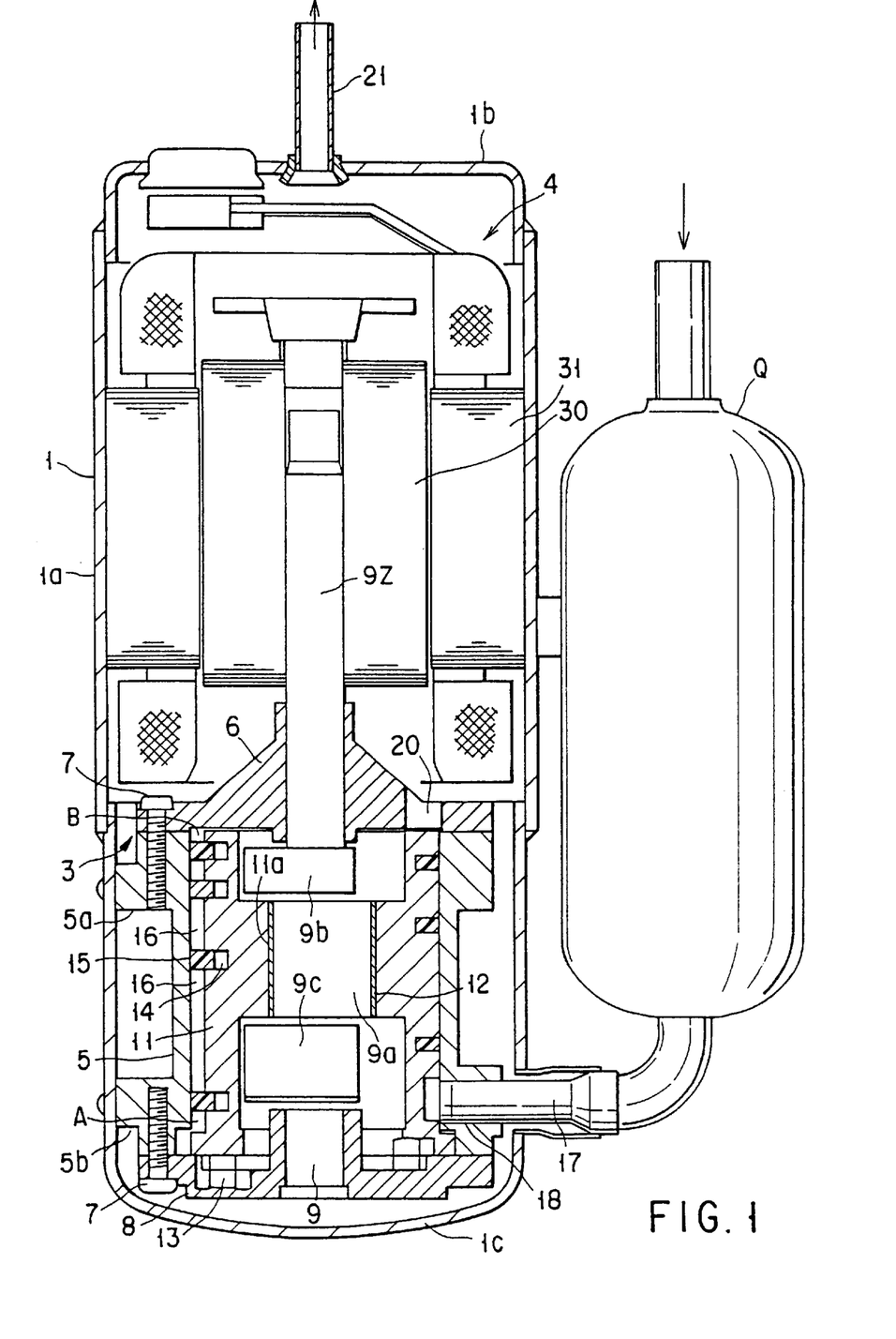
FIG. 1 is a sectional view of a helical blade type compressor according to one embodiment of the present invention.

As shown in FIG. 1, a sealed case 1 is made up of: a main case body 1a which is installed, with its axis extending in the vertical direction, and which has two open ends; an upper lid 1b for closing the upper open end of the main case body 1a; and a lower lid 1c for closing the lower open end thereof.

A helical blade type compressor mechanism section 3 and an electric motor section 4 are arranged inside the sealed case 1. In FIG. 1, the compressor mechanism section 3 and the electric motor section 4 are located in the lower and upper regions of the sealed case 1, and the border between them is substantially at the axial center of the case 1.

The compression mechanism section 3 comprises a cylinder 5 which is a hollow cylinder and which has a pair of flanges 5a and 5b on the outer circumferential wall at the respective ends. The cylinder 5 is formed of an iron-based material. The flanges 5a and 5b are forcibly inserted into the main case body 1a of the case 1, so as to position cylinder 5.

A main bearing 6 is secured to the upper end face of the cylinder 5 by means of a fixing tool 7, thereby closing the upper open end of the cylinder. An auxiliary bearing 8 is secured to the lower end face of the cylinder 5 by means of a fixing tool 7, thereby closing the lower open end of the cylinder.

A crankshaft 9 is inserted between the main and auxiliary bearings 6 and 8 such that it extends along the axes of the bearings 6 and 8. The crankshaft 9 is rotatably supported. The crankshaft 9 not only penetrates the cylinder 5 between the main and auxiliary bearings 6 and 8 but also protrudes from the main bearing in the upward direction, as viewed in FIG. 1. That portion of the crankshaft 9 protruding from the main bearing constitutes the rotating shaft 9Z of the electric motor section 4.

Between the main and auxiliary bearings 6 and 8, a crank 9a is integrally provided for the crankshaft 9. The axis of the crank 9a is shifted from that of the crankshaft 9 by a predetermined distance.

A first counter balancer 9b and a second counter balancer 9c are integrally provided for the crankshaft 9 on the upper and lower sides of the crank 9a. The axes of these counter balancers 9b and 9c are shifted in the opposite direction to that of the crank 9a.

A roller 11 (rotating member) formed of an aluminium alloy (i.e., an aluminium-based material) is interposed between the crankshaft 9 and the cylinder 5. The roller 11 is made of a cylindrical body which is open at both ends. The axial length of the roller 11 is equal to that of the cylinder 5.

To further explain the roller 11, the inner circumferential wall portion of the roller 11 which opposes the crank 9a of the crankshaft 9 defines an eccentric hole section 11a. The eccentric hole section 11a has the same width as the crank 9a and is rotatable or in sliding contact with the outer circumferential wall of the crank 9a.

A thin sleeve 12 formed of an iron-based material is forcibly inserted such that it is in contact with the inner circumferential wall of the eccentric hole section 11a. The sleeve 12 is supported such that it is in sliding contact with the crank 9a of the crankshaft 9.

With this structure, the roller 11 is coaxial with the crank 9a, and the axis of the roller 11 is shifted from that of the cylinder 5 by the same distance as the axis of the crank 9a is. The outer circumferential wall of the roller 11 is in rolling contact with part of the inner circumferential wall of the cylinder 5, such that the contact portion extends in the axial direction.

The lower portion of the roller 11 is supported by the auxiliary bearing 8, and the lower end face of the roller 11 serves as a thrust face. An Oldham's mechanism 13 for restricting the axial rotation of the roller 11 is interposed between the auxiliary bearing 8 and the lower end of the roller.

When the crankshaft 9 rotates, the crank 9a rotates in an eccentric manner, and the roller 11, which is supported on the outer circumferential wall of the crank 9a, revolves in an eccentric manner around the axis of the crankshaft 9. In accordance with the rotation of the roller 11, the rolling contact portion between the outer circumferential surface of the roller and the inner circumferential portion of the cylinder 5 gradually moves in the circumferential direction of the cylinder 5.

A helical groove 14 is formed in the outer circumferential wall of the roller 11 such that the pitch of the groove gradually decreases from the end cured to the auxiliary bearing 8 to the end secured to the main bearing 6. A helical blade 15 is arranged along the groove in such a manner that it can be moved into or away from the groove.

The blade 15 is formed of a fluoroplastic material, and has an inner diameter greater than the outer diameter of the roller 11. To be more specific, the blade 15 is inserted in the helical groove 14, with its diameter forcibly reduced. Therefore, when the roller 11 is assembled within the cylinder 5, the blade 15 expands and the outer circumferential face of the blade 15 is kept in contact with the inner circumferential surface of the cylinder at all times.

As described above, the rolling contact position of the roller 11 with reference to the cylinder 5 moves in accordance with the revolution of the roller 11. The blade 15 gradually enters the helical groove 14 when the rolling contact position comes closer to the blade 15. When the rolling contact position is on the blade 15, its outer circumferential surface is completely flush with the outer circumferential wall of the roller.

After the rolling contact position passes the blade 15, the blade 15 protrudes from the helical groove 14 in accordance with the distance by which the blade 15 is away from the rolling contact position.

The protrusion length of the blade 15 becomes a maximum when the blade 15 is 180° away from the rolling contact position. Thereafter, the blade 15 moves closer to the rolling contact position again, and the operation described above is repeated.

When the cylinder 5 and the roller 11 are viewed in a cross section taken in their radially direction, it can be understood that the cylinder 5 is eccentric with reference to the roller 11, and that the circumferential surface of the roller is partly in contact with the cylinder. This means that a crescent space is defined between the cylinder and the roller.

If this space is viewed in the axial direction, it can be understood that the region between the roller 11 and the cylinder 5 is divided into a plurality of spaces by the blade 15, since the blade 15 is arranged along the helical groove 14 of the roller 11 and the outer circumference of that blade 15 is in rolling contact with the inner circumferential surface of the cylinder 5.

The divided spaces will be referred to as compression chambers 16. Because of the manner in which the helical groove 14 is formed, the volumes of the compression chambers 16 gradually decrease from the end secured to the auxiliary bearing 8 to the end secured to the main bearing 6. In addition, because of the manner in which the pitch of the helical groove 14 is varied, the compression chamber 16 at the lower end serves as an inlet port A, while the compression chamber 16 at the upper end serves as an outlet port B.

A suction pipe 17 communicating with an accumulator Q penetrates the side wall of the lower lid 1c of the sealed case 1. Inside the sealed case, the suction pipe 17 is connected to a gas suction port 18 provided in the circumferential face of the lower flange 5b of the cylinder 5. The accumulator Q communicates with an evaporator (not shown), which constitutes part of a refrigeration cycle.

The gas suction port 18 is an opening extending to the inner circumferential surface of the cylinder 5, and is open in opposition to the outer circumferential surface of the roller 11. The gas suction port 18 sucks a refrigerant gas and guides it into the compression chambers 16 defined between the roller 11 and the cylinder 5.

The gas suction port 18 is located at the lower end of the cylinder 5, and communicates with one end of the compression chambers 16. The main bearing 6 is provided with a discharge hole 20 extending in parallel to the axial direction, and the highly-pressurized gas, which is compressed in the compression chambers 16, is discharged and guided into the interior of the sealed case 1. A discharge pipe 21 is connected to the upper lid 1b of the sealed case 1, and this discharge pipe 21 communicates with a condenser (not shown), which constitutes part of the refrigeration cycle.

The electric motor section 4 comprises: a rotor 30 into which the rotating shaft 9Z of the crankshaft 9 protruding from the main bearing 6 is inserted; and a stator 31 attached to the inner circumferential surface of the main case body 1a, with a predetermined gap maintained between the stator and the outer circumferential surface of the rotor 30.

In the helical blade type fluid compressor designed as above, power is applied to the electric motor section 4, so as to rotate the crankshaft 9 together with the rotor 30. The torque of the crankshaft 9 is transmitted to the roller 11 through the crankshaft 9a.

Since the crankshaft 9a is eccentric and the eccentric hole section 11a of the roller 11 rotatably engages therewith, the roller is pushed by the crankshaft 9a. In addition, the Oldham's mechanism 13 interposed between the roller 11 and the auxiliary bearing 8 restrains the roller 11 from rotating on its own axis. As a result, the roller revolves around the given axis.

A low-pressure refrigerant gas is sucked from the suction pipe 17 through the accumulator Q. The sucked gas is guided from the gas suction port 18 to the compression chamber 16 serving as the inlet port A. Since the roller revolves around the given axis, the rolling contact position at which the roller contacts the inner circumferential surface of the cylinder 5 gradually moves in the circumferential direction. The blade 15 goes into or comes out of the helical groove 14. In other words, the blade 15 is inserted into the groove 14 and then protrudes therefrom, both in the radial direction of the roller.

The refrigerant gas guided to the compression chamber 16 serving as an inlet port, gradually flows toward the compression chamber serving as an output port in accordance with the revolution of the roller 11.

The pitch of the blade 15 gradually decreases from the inlet port A to the outlet port B, and the volumes of the compression chambers 16 partitioned by the blade 15 also decrease in the same direction. Therefore, the refrigerant gas is compressed when it sequentially flows through the compression chambers. When the refrigerant gas reaches the compression chamber serving as output port 10, it is in the pressurized state; its pressure takes a predetermined large value.

The high-pressure gas is discharged from the compression chamber 16 of the outlet port B, and is guided into the electric motor section 4, i.e., the upper region of the space of the sealed case 1, by way of the discharge hole 20 of the main bearing 6. Thereafter, the high-pressure gas is led to the condenser by way of the discharge pipe 21 provided for the upper end of the sealed case 1.

In the embodiment described above, the cylinder 5 is formed of an iron-based material, the roller 11 is formed of an aluminium alloy, and the helical blade 15 is formed of a fluoroplastic material. The coefficients of thermal expansion of these materials satisfy the following relationships:

(blade 15)>(roller 11)>(cylinder 5)

In other words, the materials of the blade 15, roller 11 and cylinder 5 must be so selected as to satisfy the above relationship.

The compression chambers 16 are defined by the cylinder 5, the roller 11 and the blade 15, and the clearances between these structural components have much effect on the compression performance and the gas behavior.

Figure 2A:
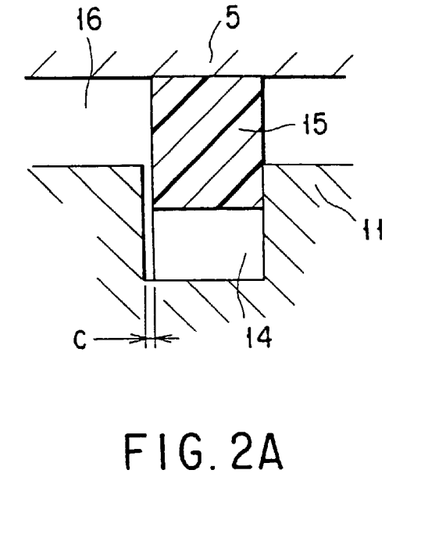
FIGS. 2A and 2B are explanatory diagrams illustrating clearances in the first embodiment.
Figure 2B:
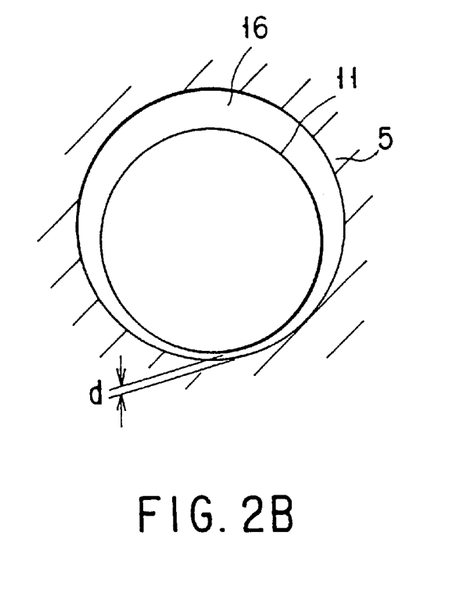

FIGS. 2A and 2B show how a clearance is formed.

Referring to FIG. 2A, where the material of the helical blade 15, which moves into or come out of the helical groove 14 of the roller 11, has a larger coefficient of thermal expansion than the material of the roller 11, clearance c formed therebetween is large under a low-temperature condition, and is small under a high-temperature condition.

Referring to FIG. 2B, where the material of the roller 11 has a larger coefficient of thermal expansion than the material of the cylinder 5, clearance d formed therebetween is large under a low-temperature condition, and is small under a high-temperature condition.

During a compressing operation, the clearances should be as small as possible so as to enhance the compression performance. When the compressor has just been actuated or under a low-temperature condition in which backward flow of liquid is likely to occur, the pressures in the compression chambers 16 may increase-rapidly as a result of the compression of liquid. In order to protect the blade 15 from damage in spite of the rapid pressure increase, a certain amount of refrigerant should be made to leak from the compression chambers 16.

As described above, the coefficient of thermal expansion of the material of the blade 15 is larger than that of the material of the roller 11. Therefore, the clearance between the blade 15 and the helical groove 14 of the roller is small when the temperature is high, and is large when the temperature is low. Accordingly, the operating condition described above is attained.

In addition, the coefficient of thermal expansion of the material of the roller 11 is larger than that of the material of the cylinder 5. Therefore, the clearance between the roller 11 and the cylinder 5 is small when the temperature is high, and is large when the temperature is low. Accordingly, the operation condition described above is attained. Moreover, since the roller 11 is formed of an aluminium alloy, it is lighter in weight than a conventional roller formed of cast iron. Hence, the vibration and noise during operation can be suppressed.

The sliding portion between the roller 11 and the crankshaft 9 has nothing to do with the compression performance of the compression chambers 16. It is therefore ideal to maintain the same clearance between the roller 11 and the crankshaft 9 without reference to the temperature. Since the roller 11 and the crankshaft 9 are such components as are exerted with a large force which is due to the gas load, the clearance between them is of special importance.

However, the roller 11 is formed of an aluminium alloy, and the crankshaft 9 is formed of an iron-based material. Since they are formed of completely-different kinds of materials, there is a large difference in the coefficients of thermal expansion between them. Since the clearance varies greatly, it is very likely that galling will occur.

The present invention has solved this problem by employing the sleeve 12 formed of the same material as the crankshaft 9 and arranging that sleeve 12 only at the region where the roller and the crankshaft 9 are in sliding contact.

The sleeve 12 is formed of the same iron-based material as the crankshaft 9 and is forcibly inserted such that it is in contact with the inner circumferential wall of the eccentric hole section 11a. Accordingly, the clearance between the roller 11 and the crankshaft 9 is constant without reference to the temperature.

The roller 11, formed of an aluminium alloy, may be overlaid with an electroless plating layer formed of Ni, so as to improve the abrasion resistant characteristic.

To be more specific, the aluminium alloy of the roller 11 is an Al—Si alloy containing 3% of Si (silicon) by mass or more, the precipitation area ratio of initial crystallized Si is 20% or less, the average particle diameter of initially crystallized Si particles is 30 µm or less (the average particle diameter being measured as the diameter of a corresponding circle), and the hardness of the compound is HRB60 or more.

Figure 3A:
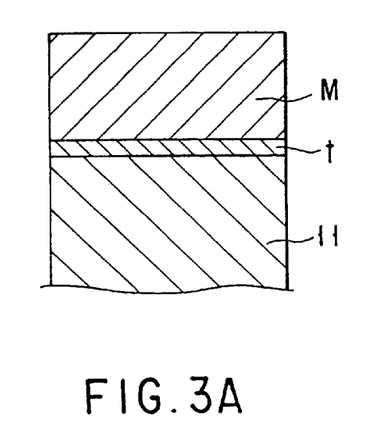
FIGS. 3A and 3B are explanatory diagrams showing an electroless plating layer formed on the roller surface of the embodiment.

As shown in FIG. 3A, the electroless plating layer M on the surface of the roller 11 made of the aluminium alloy is formed on a displacement plating layer t. It has a film hardness of Hmv 500 or more and is formed at least inside the helical groove 14 and on that portion which opposes the Oldham's mechanism 13, in such a manner that the thickness of the layer is within the range of 5 to 30 µm. The film thickness deviation is within ±20% of the average thickness.

To be more specific, the electroless plating layer is either an alloy plating layer or a dispersion (composite) plating layer M which is formed on the displacement plating layer t provided on the surface of the roller 11 and which contains 80% of Ni by mass or more.

Figure 3B:
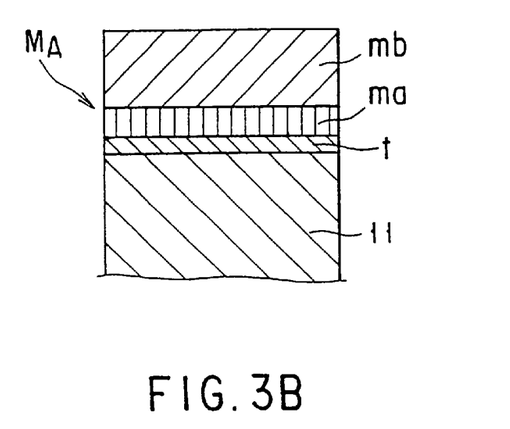

Alternatively, as shown in FIG. 3B, a two-layered electroless plating layer MA made up of a base plating layer ma and an upper plating layer mb may be provided. In this case, the base plating layer ma is formed on the displacement plating layer t provided on the surface of the aluminium alloy base material 11 and contains 80% of Ni by mass or more.

The electroless plating layer may be formed of a three-alloy material based on (Ni—P), (Ni—B) or (Ni—P—B).

Also, the electroless plating layer may be made up of a matrix formed of a three-alloy material of (Ni—P), (Ni—B) or (Ni—P—B), and either a plating layer in which rigid particles of SiN, SiC and BN are dispersed in an amount of 20% by mass or less, or a plating layer in which rigid particles, self-lubrication materials such as C, PTFE, mica, and $MoS_2$ are dispersed in an amount of 20% by mass or less.

The two-layered electroless plating layer MA mentioned above may be modified such that it comprises a base plating layer formed of Ni—P and an upper plating layer which is formed continuously with the base plating layer and which is one of: a layer formed of an alloy material of either Ni—B or Ni—P—B; a layer in which rigid particles of SiN, SiC and BN are dispersed in an amount of 20% by mass or less; and a layer in which self-lubrication materials such as C, PTFE, mica, and $MOS_2$ are dispersed in an amount of 20% by mass or less.

With respect to the two-layered electroless plating layer MA, it is most desirable that the thickness ratio of the upper layer mb to the lower layer ma be within the range of 9/1 to 2/1.

Figure 4:
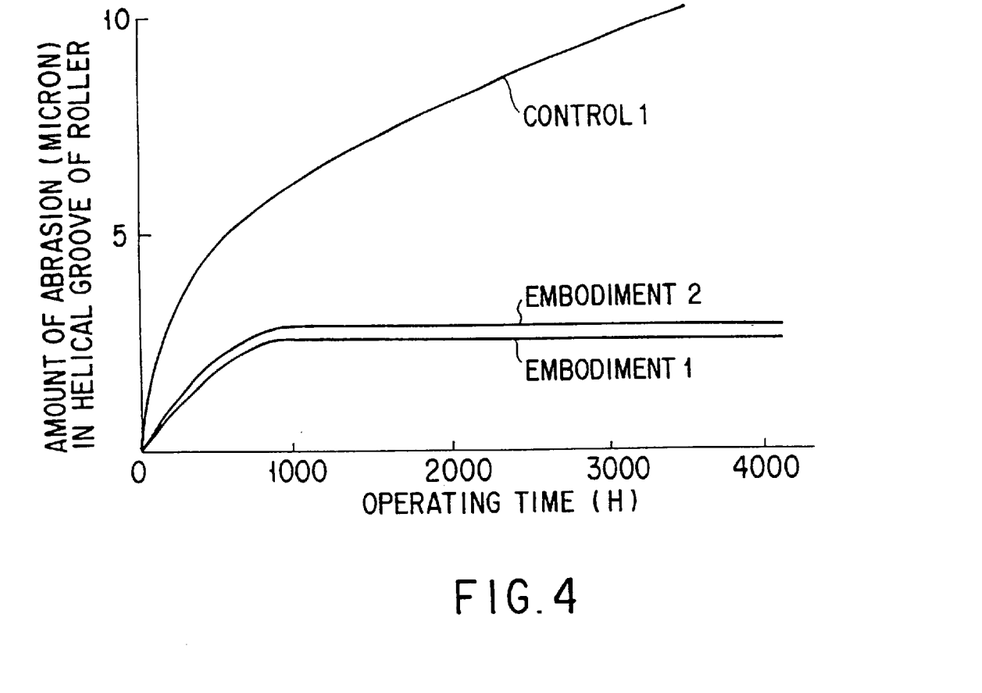
FIG. 4 is a graph showing how the amount of abrasion in the helical groove of the roller is associated with the operating time in the embodiment.
Figure 5:
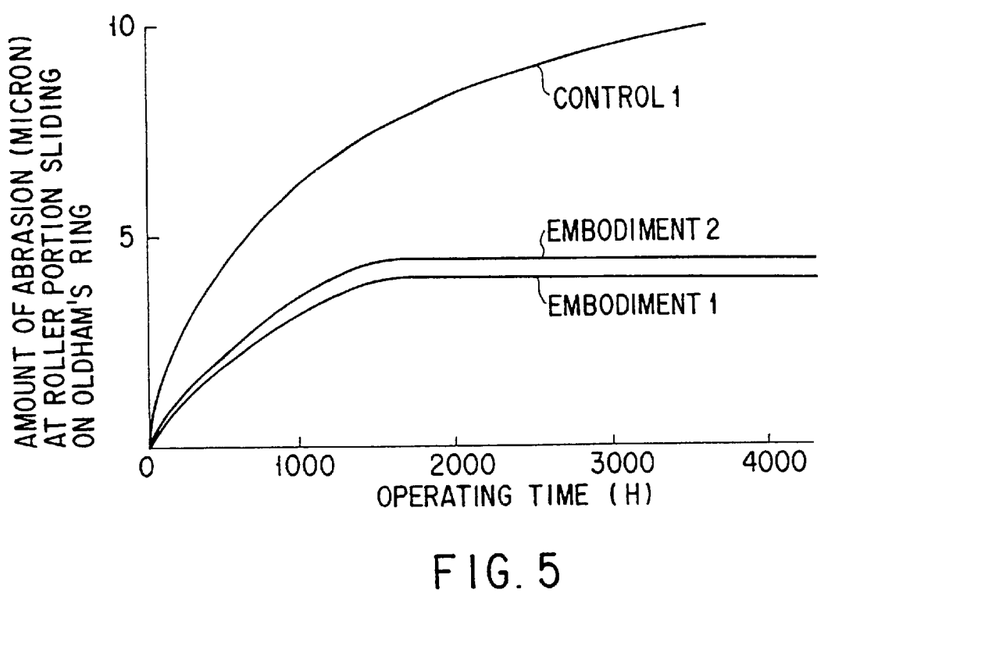
FIG. 5 is a graph showing how the amount of abrasion at the Oldham's mechanism sliding section of the roller is associated with the operating time in the embodiment.

FIGS. 4 and 5 are graphs showing how the amount of abrasion in the helical groove 14 is associated with the operating time. The data in the graphs were obtained in a durability test in which rollers of different materials were tested. The characteristics of Embodiment 1, those of Embodiment 2 and those of Control 1 are shown in TABLE 1.

TABLE 1

|  | Embodiment 1 | Embodiment 2 | Control 1 |
|---|---|---|---|
| Refrigerant | R410A | R410A | R410A |
| Lubricant | Ester Oil | Ester Oil | Ester Oil |
| Roller |  |  |  |
| Surface Treatment | Ni—P—B/Ni—P | Ni—B | — |
| Film Thickness | 15/5 | 20 | — |
| Basic Material | AL—10% Si—2Cu | AL—10% Si—2Cu | AL—10% Si—2Cu |
| Blade | PTFE (10% gf) | PTFE (10% GF) | PTFE (10% GF) |
| Oldham's Ring | Al Casting | Sintered Alloy | Sintered Alloy |

In TABLE 1, "PTFE (10% GF)" represents a tetraethylene fluoride to which glass fibers are added for reinforcement in an amount of 10%. The "AL Casting" corresponds to JIS ACSC, and "Sintered Alloy" corresponds to JIS SMF4.

In Embodiments 1 and 2, wherein the surface of the roller 11 was covered with a plating layer formed in the electroless plating method, the amount of abrasion in the roller 11 and the Oldham's ring 13 did not significantly increase after the initial running abrasion occurred at the start of operation. In the Embodiments, therefore, a stable operation could be performed for a long period of time.

In contrast, in Control 1, wherein no electroless plating layer was not provided on the surface of the roller 11, the amount of abrasion in the roller 11 and the Oldham's ring 13 kept increasing in accordance with an increase in the operating time. A stable operation became impossible in a short period of time.

With the above structure, the following can be pointed out:

(1) The machining (cutting characteristics=tool life) can be improved by optimally determining the structure (the area ratio of initially crystallized Si and the diameters of precipitated Si particles) of the aluminium alloy, which serves as the base material of the roller 11.

(2) A uniform film thickness distribution is attained by forming an electroless plating layer having a small coefficient of friction on the surface of the roller 11, and the working required thereafter can be a minimum, resulting in cost reduction.

(3) Although the base material of the roller 11 is an aluminium alloy, the abrasion of the roller 11 per se and the abrasion of a member with which the roller is brought into sliding contact are both minimums. This is because the electroless plating layer formed on the surface of the roller 11 is very rigid and has a small coefficient of friction.

Due to the rigidity, the raw material of the blade 15 and the additive to be added to the raw material for reinforcement of the blade 15 can be selected with a high degree of freedom. Due to the rigidity and the small coefficient of friction, the Oldham's mechanism 13, which is a revolving component like the roller 11, can be formed of an aluminium alloy which is light in weight. Accordingly, the performance of the compressor can be enhanced.

(4) Where the electroless plating layer on the surface of the roller 11 is of a two-layered structure, the base plating layer of Ni—P has a high resistance against impact. Accordingly, the upper layer of the electroless plating layer is prevented from cracking.

(5) Due to the advantages of (3) and (4) above, high reliability is attained not only in an environment in which HCFC (a typical example of which is R22) and mineral oil are used, but also in an environment in which an HFC refrigerant (a typical example of which is R410A) that does not include chlorine atoms and may therefore decrease in abrasion resistance) and synthetic fluid (e.g., ester oil and polyether oil) are used.

A description will now be given as to how the material of the blade 15 is selected.

Where the blade 15 is formed of so-called a super engineering plastic material (hereinafter referred to as SEP material), which is a thermoplastic resin material improved in heat resistance, oil resistance and refrigeration, the adverse effects caused by the thermal expansion and the pressure condition can be suppressed to a minimum, thus improving the compression characteristics and the reliability.

A specific manner in which the present invention is reduced to practice will be described.

In order to confirm the advantages arising from application of the SEP material to the blade 15, a blade was actually formed by injection molding by use of a PEEK resin material (Victrex 450G [trade name] commercially available from Sumitomo Chemical Co., Ltd.), and the compression performance was measured by use of the blade. As a control, another blade was formed by use of a PTFE resin material (7-J commercially available from DuPont-Mitsui Fluorochemicals Co., Ltd.) having a density of 2.1 g/cm$^3$, and the compression performance was measured under the same condition.

In order to examine the effects which the moduli of elasticity and the thermal expansion of the materials may have on the compression performance, the coefficients of performance (COP) of the compressors were measured immediately after the assembly of the compressors and after 100 hours' operation, under the condition where the temperatures of the cases were 80° C., 100° C. and 120° C. Needless to say, the clearance between the blade 15 and the helical groove 14 was determined in consideration of the thermal expansion caused when the temperature of the sealed case 1 was highest (=120° C.).

Table 2 shows test results of the embodiment, the test results being indicated such that the coefficient of performance measured immediately after the assembly of the compressor of the embodiment and when the temperature was 80° C. is expressed as 100%. The amounts of abrasion of the blade, which were measured after 100 hours' operation, are also indicated in the Table.

TABLE 2

| Blade | Embodiment | | | Control | | |
|---|---|---|---|---|---|---|
| Temperature | 80° C. | 100° C. | 120° C. | 80° C. | 100° C. | 120° C. |
| Coefficient of Performance Measured Immediately After Assembly | 97 | 99 | 100 | 75 | 89 | 100 |
| Coefficient of Performances Measured After 100 hours' use | 105 | 106 | 108 | 85 | 87 | 88 |
| Amount of Abrasion After 100 hours' use | 3 μm | 3 μm | 4 μm | 25 μm | 40 μm | 55 μm |

As shown in Table 2, the blade 15 formed of the PEEK resin material according to the embodiment did not show any significant difference between the coefficient of performance measured immediately after the assembly and that measured after 100 hours' operation. An improvement in performance, which was attributable to the fit between the sliding surfaces, was observed after the elapse of time. In addition, the temperatures of the cases did not give rise to a large difference in performance.

With respect to the conventional blade formed of the PTFE resin material, however, it was observed that the temperatures of the cases brought about a large difference in the compression performance measured immediately after the assembly. An improvement was observed in the compression performance measured after 100 hours' operation, and the improvement was attributable to the fit between the sliding surfaces, as in the case where the PEEK resin material was used. It was also observed, however, the compression performance was degraded in accordance with an increase in the temperature of the case.

The results described above show that the amount of abrasion is large in the case of the conventional PTFE resin material and is small in the case of the PEEK resin material, as can be seen from the data on the blade abrasion. In accordance with an increase in the temperature of the case, the amount of abrasion of the blade increases, degrading the compression performance.

In the case of the conventional PTFE resin material, the coefficient of thermal expansion is large. When the initial clearance is determined in consideration of the clearance exhibited at the upper limit of the temperature range in which the compressor is used, the clearance may be unnecessarily large when the temperature of the compressor is comparatively low. As a result, the compression performance becomes poor. At a high temperature, not only the softness of the PTFE resin material but also the modulus of elasticity thereof decreases further. In this case, the blade deformation shown in FIG. 14 may easily occur, and the amount of abrasion is considered to have increased.

Where the blade is formed of the PEEK resin material and is made by injection molding in such a manner as to have unequal pitches conforming with that of the helical groove 14, the movement of the blade with reference to the helical groove is not prevented or restricted. In comparison with the PTFE resin material, the PEEK resin material does not greatly expand by heat. Therefore, even if the initial clearance is determined in consideration of the clearance exhibited at the upper limit of the temperature range in which the compressor is used, the clearance at a low temperature is appropriate nevertheless. Hence, the performance of the compressor does not significantly decrease. Moreover, since the modulus of elasticity is large at high temperature, satisfactory compression performance can be maintained in a wide temperature range.

As described above, the use of the SEP material for the blade 15 satisfies the environmental conditions under which the compressor can be used (such as the heat resistance, oil resistance and refrigerant resistance). In addition, the SEP material has a modulus of elasticity that is 4 to 10 times larger than that of a fluoplastic material and a coefficient of linear expansion that is ⅓ or less of that of the fluoplastic material. Accordingly, the use of either material produces the same advantages.

In order to attain smooth movement of the blade 15 with reference to the helical groove, it is through to provide a hollow region in the interior of the blade 15. The advantages arising from this structure remain unchanged even when the SEP material is used.

Figure 6:
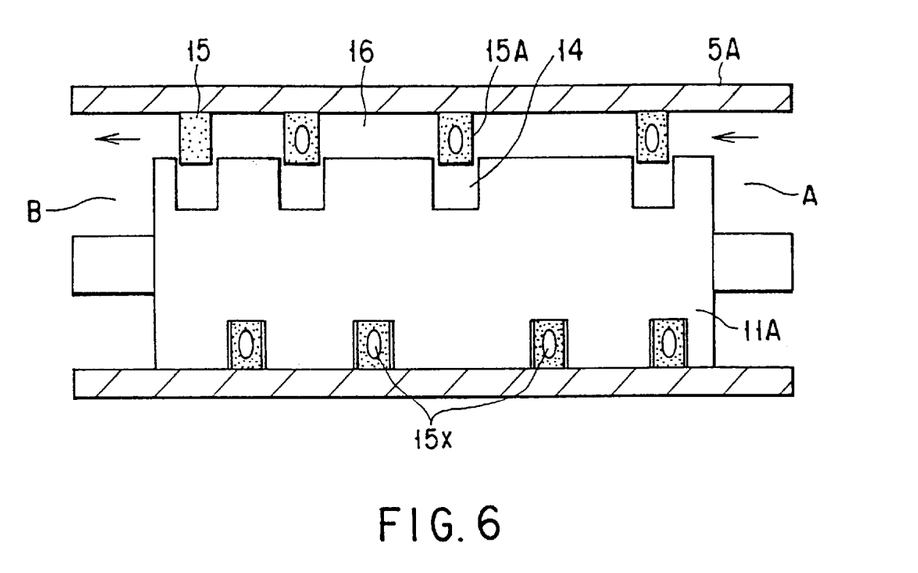
FIG. 6 shows the hollow structure of the blade employed in the compression mechanism of another embodiment.
Figure 7A:
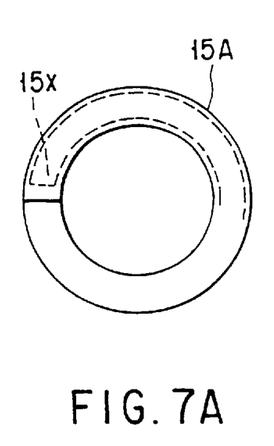
FIGS. 7A–7C show the structure of the blade employed in the embodiment.
Figure 7B:
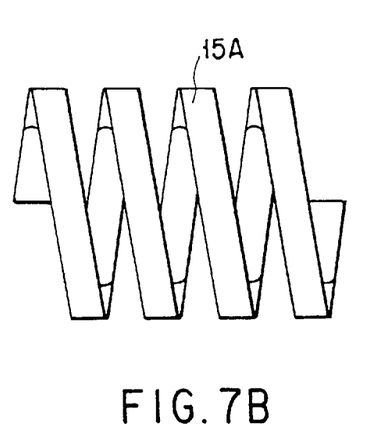
Figure 7C:
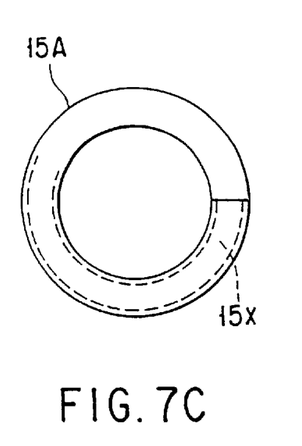

As shown in FIGS. 6 and 7, the helical blade type compressor is a type wherein the roller 11A is arranged at an eccentric position inside the cylinder 5A and is rotated together with the cylinder 5A. The hollow region 15x in the blade 15A is formed such that it extends from the inlet port A (i.e., a low-pressure end) to the outlet port B (i.e., a high-pressure end). The hollow region 15x is closed at the outlet port so that it does not communicate with the compression chamber.

A PEEK resin (Victrex 450G [trade name] commercially available from Sumitomo Chemical Co., Ltd.) is used as the material of the blade 15A. As a control, a blade having no hollow region was fabricated by use of the same material, and the compression performance was measured under the same conditions.

When the compression performance was measured, the temperature was kept low (the room temperature was kept low) and the compressor was driven at low speed, such that the liquid-state refrigerant can be sucked into the compressor. The results of measurement are shown in Table 3, where the coefficient of performance (COP) of a blade formed of PEEK resin material and having no hollow region is indicated as 100 as a control. The amount of blade abrasion after the measurement is also indicated in the Table.

TABLE 3

| Blade | Embodiment Peek Resin With Hollow Region | Control Peek Resin Without Hollow Region |
|---|---|---|
| Coefficient of Performance of Compressor | 115 | 100 |
| Amount of Abrasion | 3 μm | 25 μm |

As shown in Table 3, the blade according to the control, which was formed of the PEEK resin material and had no hollow region, had a poor compression performance and the amount of blade abrasion was large (25 μm). Probably, this was because the load exerted on the blade increased due to the liquid compression of the refrigerant.

The blade 15A according to the embodiment was also formed of the PEEK resin material but had a hollow region 15x extending from the low-pressure end to the high-pressure end. In spite of the use of the same material, however, the compressor employing that blade exhibited compression performance that was as high as 115%. In addition, the amount of blade abrasion was small (3 μm). Probably, this was because the hollow region 15x served as a liquid reservoir for temporarily storing a liquefied refrigerant and therefore suppressed the liquid compression.

However, if the formation of a hollow region 15x is applied to a blade made of a soft fluoroplastic material as measures for coping with the liquid compression (excessive compression), a low-pressure refrigerant enters the hollow region 15x, and a large pressure difference is produced at the high-pressure end of the blade 15A. Due to this pressure difference, the blade 15A is deformed. Since, therefore, the sealing characteristic becomes poor, the compression performance is low under steady-state operating conditions.

As described above, the blade 15A is formed of a SEP material having a small coefficient of thermal expansion and having a large modulus of elasticity at high temperature, and the hollow region 15x is provided in the blade 15A. By use of such a blade 15A, the compressor can maintain high compression performance and high reliability under a variety of operation conditions, even under the transient situation where the liquid-state refrigerant is sucked. The hollow region 15x in the blade 15A can be easily formed by gas assist formation.

Figure 8A:
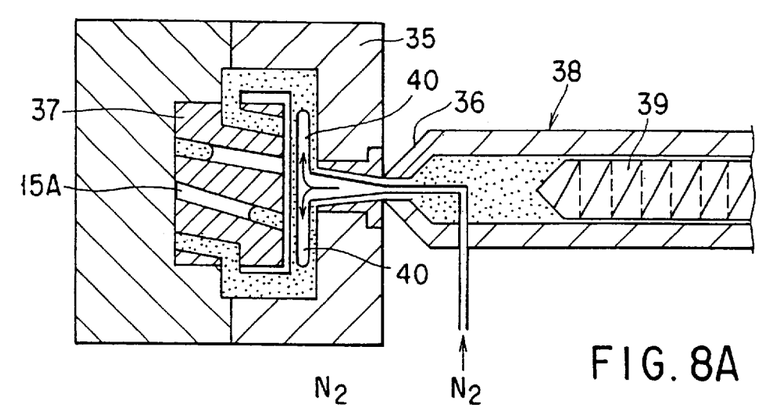
FIG. 8A is an explanatory illustration showing an example of a gas assist formation method.
Figure 8B:
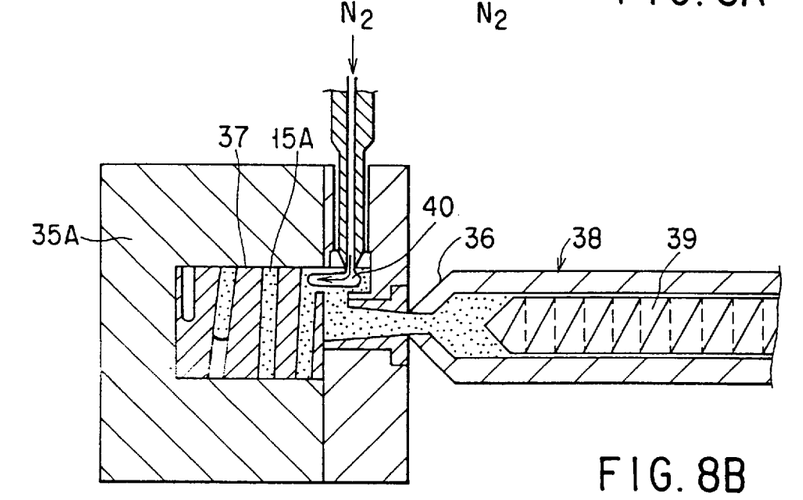
FIG. 8B is an explanatory illustration showing another example of a gas assist formation method.
Figure 8C:
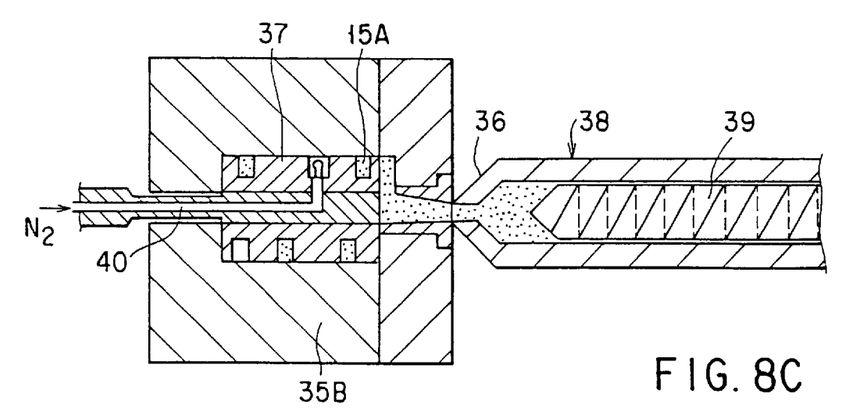
FIG. 8C is an explanatory illustration showing still another example of a gas assist formation method.

FIGS. 8A–8C show an example of a manner in which a blade is formed by a gas assist formation method (Asahi Chemical Industry Co., Ltd.: AGI method).

FIG. 8A shows a two-gate type mold 35, and a gas is injected from a nozzle 36 of an injection molding machine. Reference numeral 37 denotes a core, numeral 38 denotes a cylinder, numeral 39 denotes a screw, numeral 40 indicates gas injection, and numeral 15A denotes a blade.

FIG. 8B shows a formation method which uses a one-gate mold 35A and in which gas is injected from an end of the blade at the fixed mold, as indicated by numeral 40. The other portions of the injection molding machine are similar to those of the machine described above.

FIG. 8C shows a formation method which uses a one-gate mold 35B and in which gas is injected from an intermediate inner circumferential portion of the blade at the movable mold, as indicated by numeral 40. The other portions of the injection molding machine are similar to those of the machine described above.

As described above, according to the gas assist method, a unit is connected to an ordinary type of injection molding machine. A high-pressure nitrogen gas is injected, in the pressurized state, into the interior of the formation nozzles 38 and molds 35–35B such as those shown in FIGS. 8A–8C.

In order to examine how the dimensional accuracy is influenced by the resin materials used in the gas assist method, a blade 15A was actually manufactured in the gas assist method explained with reference to FIG. 8B, wherein resin for filling is supplied from an end of the blade.

A PEI resin material (Ultem 1000 commercially available from GE Plastics Co., Ltd.) was used as the material, and a fluoloplastic material (PFA340-J commercially available from DuPont-Mitsui Fluorochemicals Co., Ltd.) was used as a control. To compare these, the dimensions of the blade were measured at nine positions, with the gate portion of the blade being indicated as No. 1, and the blade end that is opposite to the gate portion being indicated as No. 9. The blade shrink mark (i.e., the dimensional difference at the center portion of a cross section of the blade) is shown in FIG. 9.

Figure 9:
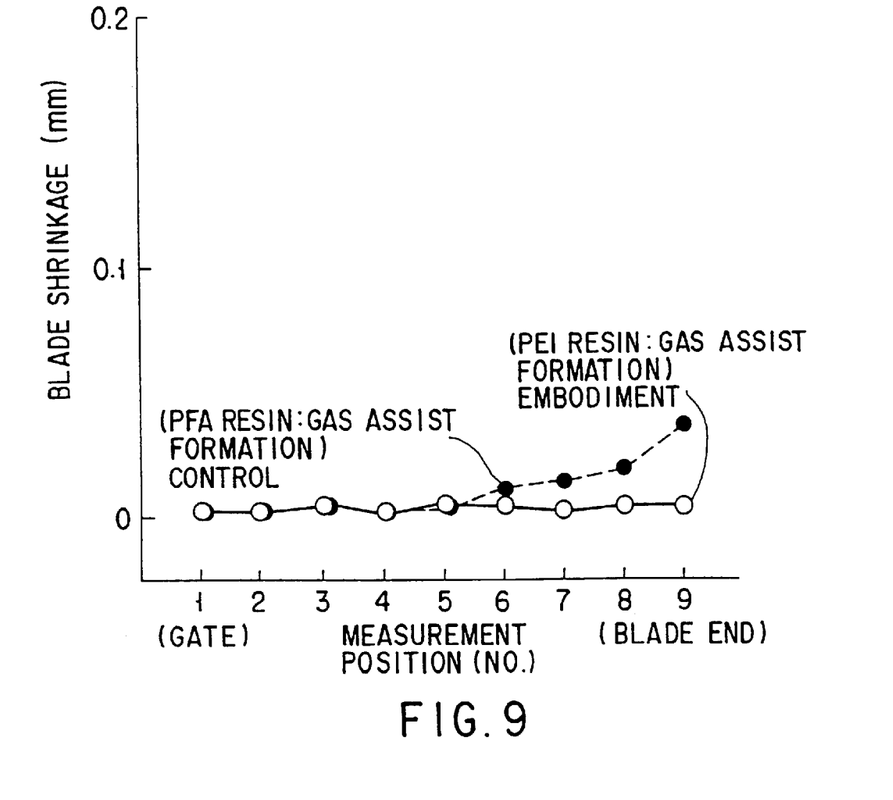
FIG. 9 is a graph in which the effects of the gas assist formation according to the embodiment and the effects of the gas assist formation according to a control are compared with each other.

As can be seen from FIG. 9, the blade shrink mark was hardly observed with respect to the case where the PEI resin material was used, whereas it was observed at the end portion of the blade with respect to the case where PFA resin material was used.

Figure 10A:
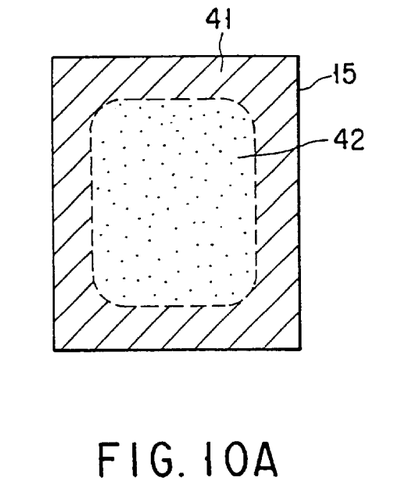
FIGS. 10A and 10B are illustrations explaining the shrink mark which may occur when the blade employed in the embodiment is manufactured.
Figure 10B:
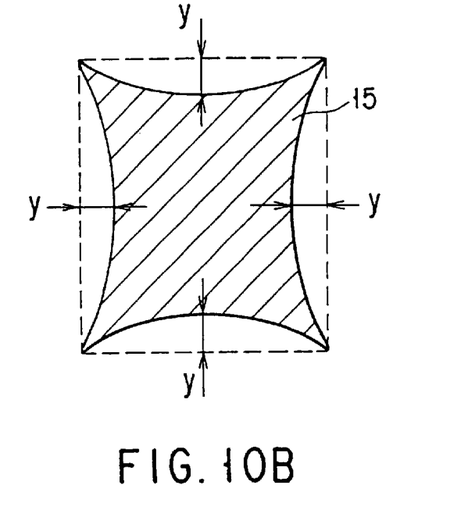

How the blade shrink mark occurs is shown in FIG. 10A. As shown, the surface layer 41 of the blade 51 cools and hardens a predetermined time after the formation of the blade 15. At the time, however, the interior 42 of the blade 51 is still in the molten state.

A predetermined time thereafter, the interior 42 of the blade 51 cools and hardens. Since the volume of the blade decreases then, the surfaces of the blade are pulled to the core portion, resulting in a blade shrink mark indicated by y.

The blade shrink mark is marked in the case of the fluoroplastic material since it has a large mold shrinkage factor. All surfaces of the blade 15 are sealing surfaces. The gate from which resin is injected should not be provided at an intermediate position of the helical structure since the gate provided at such a position adversely affects the smoothness of the surfaces. This being so, the gate must be located at an end of the blade. This structure, however, has problems in that the resin has to flow for a long distance and the pressure with which the resin is injected is not much transmitted to the terminating end. Accordingly, the blade shrink mark occurs markedly at the position which is opposite to the gate.

In contrast, according to the gas assist formation, a high-pressure gas is injected into the interior of the blade 15A. Since the blade 15A is cooled and held by the pressurized gas in the interior of the blade, the blade shrink mark is remarkably suppressed. In addition, the pressure applied to the helical structure is uniform at any position, and low-pressure formation is enabled.

Figure 11A:
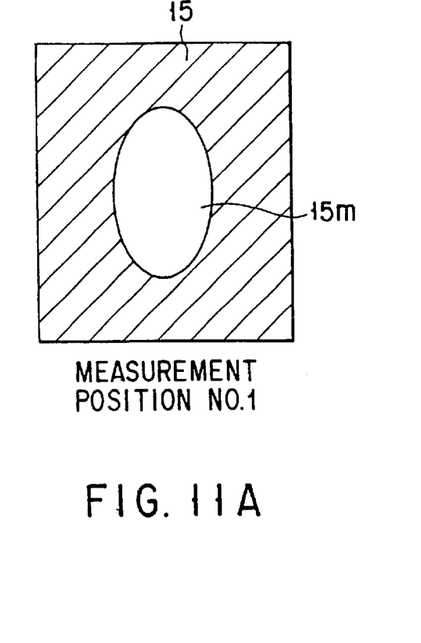
FIGS. 11A and 11B show how large the hollow section in the blade cross section is according to the control.
Figure 11B:
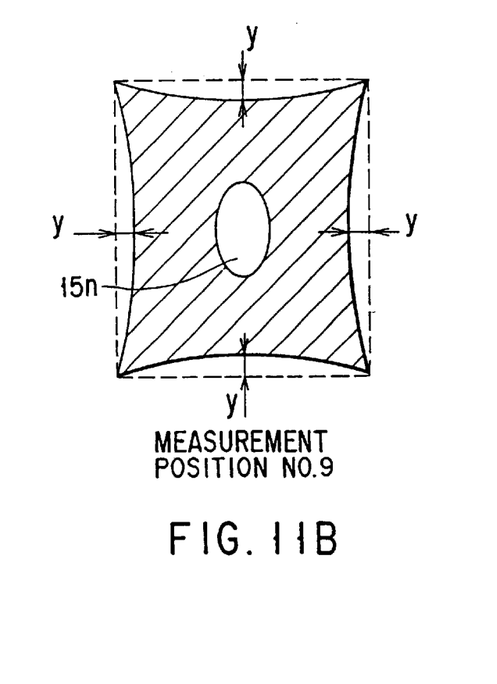

Since the PFA resin material is poor in fluidity (i.e., high in viscosity), the flow resistance of the gas is high. The hollow region 15n at measurement position No. 9 located at the blade end (hollow region 15n shown in FIG. 11B) is smaller than the hollow region 15m at measurement position No. 1 located at the gas inlet port (hollow region 15m shown in FIG. 11A).

As indicated by the control shown in FIG. 9, the shrink mark at the end portion of the blade 15 is more marked. In addition, since the PFA resin material is larger in mold shrinkage factor than the PEI resin material, the shrink mark is very marked at the blade end portion where the hollow region is small.

Figure 12A:
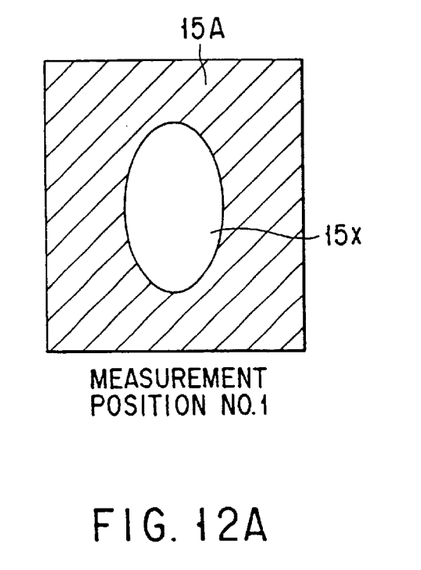
FIGS. 12A and 12B show how large the hollow section in the blade cross section is according to the embodiment.
Figure 12B:
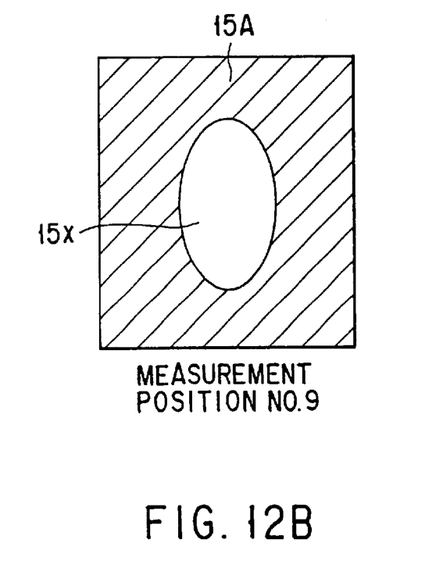

Since the PEI resin exhibits good fluidity, the hollow region 15x does not show a large dimensional difference even when it is measured at different positions, as shown in FIGS. 12A and 12B. The PEI resin material is only an example, and any kind of SEP material is improved in fluidity. In addition, the mold shrinkage factor of the SEP materials is less than ½ of that of the fluororesin material, and the SEP materials therefore serve to increase the dimensional accuracy when they are selected as the material of the blade 15A fabricated in gas assist formation method. Moreover, the use of the SEP materials ensures improves sealing characteristics and thus realizes high compression performance.

Additionally, the hollow region 15x can be formed in such a manner as to extend from the low-pressure inlet end to the high-pressure outlet end. The gas assist formation method also increases the cooling rate, as measured in a cross section, and shortens the formation cycle. Hence, the manufacturing yield is enhanced and the productivity is increased.

As can be seen from the fact that a blend of a PEEK resin material and a PES resin material exists, an SEP material can be blended with other kinds of SEP materials as long as the original characteristics are not adversely affected thereby. A composite material is also known, which contains a filler that is added to improve the sliding characteristics. Examples of fillers include inorganic fibers and a solid lubricant.

More specifically, examples of the inorganic fibers include glass fibers, carbon fibers (PAN, pitch), graphite fibers, aluminum fibers, wollastonite, potassiam titanate whisker, carbon whisker, silicon carbide whisker, etc. Examples of the solid lubricant include molybdenum disulfide, graphite, carbon, boron nitride, bronze, fluororesin, etc.

The tip seal employed in a scroll type compressor and the tip seal employed in a recently-proposed 3D scroll type compressor have a similar function to the blade of the helical blade type compressor described above.

Unlike the blade of the helical blade type compressor, these structural members do not move into or out of a helical groove. However, they are sealing members and made to slide, and thus require a great seal length. They are similar to the helical blade described above in that high dimensional precision is required. Therefore, if they are formed of an SEP material and fabricated in the gas assist method, the same advantages as pointed out above are attained.

We claim:

1. A fluid compressor comprising a helical blade type compression mechanism that includes a cylinder, a rotating member arranged inside the cylinder, and a helical blade interposed between the cylinder and the rotating member, wherein said rotating member is formed of an aluminum alloy material, said rotating member is a roller having an eccentric hole section, and a sleeve formed of an iron-based material is provided for an inner circumferential wall of the eccentric hole section.

2. A fluid compressor according to claim 1, wherein said rotating member is a roller whose surface is coated with an electroless plating layer formed mainly of nickel.

3. A fluid compressor according to claim 2, wherein said electroless plating layer is formed on a displacement plating layer, has a film hardness of Hmv 500 or more, is located at least inside the helical groove and on that sliding portion which opposes an Oldham's mechanism, and has a thickness within a range of 5 to 30 $\mu$m, said electroless plating layer having a film thickness deviation which is within ±20% of an average thickness.

4. A fluid compressor according to claim 2, wherein the electroless plating layer, which is located around the circumferential surface of the rotating member and formed mainly of nickel, is one of a one-layer structure or a two-layer structure, said electroless plating layer being formed of an alloy material which is one of N—P, Ni—B and Ni—P—B and which includes 80% of Ni by mass or more.

5. A fluid compressor according to claim 4, wherein an electroless plating coating is provided on the circumferential surface of the rotating member, said electroless plating coating employs said electroless plating layer as a matrix and includes one of: a plating layer in which rigid particles of SiN, SiC and BN is dispersed in an amount of 20% by mass or less; and a plating layer in which self-lubrication materials such as C, PTFE, mica and $MOS_2$ are dispersed in an amount of 20% by mass or less.

6. A fluid compressor according to claim 4, wherein the electroless plating layer of the two-layer structure comprises a base plating layer formed of Ni—P and an upper plating layer which is formed continuously with the base plating'layer and which is one of: a layer formed of an alloy material of either Ni—B or Ni—P—B; a layer in which rigid particles of SiN, SiC and BN are dispersed in an amount of 20% by mass or less; and a layer in which self-lubrication materials such as C, PTFE, mica, and $MoS_2$ are dispersed in an amount of 20% by mass or less.

7. A fluid compressor according to claim 4, wherein the electroless plating layer of the two-layer structure, which is provided around the circumferential surface of the rotating member, is formed such that a thickness ratio of the upper plating layer to the base plating layer is within a range of 9/1 to 2/1.

8. A fluid compressor comprising a helical blade type compression mechanism that includes a cylinder, a rotating member arranged inside the cylinder, and a helical blade interposed between the cylinder and the rotating member, wherein the rotating member is formed of an aluminum alloy material which is an Al—Si alloy containing 3% of Si (silicon) by mass or more, and which is provided such that a precipitation area ratio of initially crystallized Si is 20% or less, an average particle diameter of the initially crystallized Si is 30 $\mu$m or less (the average particle diameter being measured as a diameter of a corresponding circle), and hardness of a compound is HRB60 or more.

9. A fluid compressor according to claim 8, wherein said rotating member is a roller whose surface is coated with an electroless plating layer formed mainly of nickel.

10. A fluid compressor according to claim 9, wherein said electroless plating layer is formed on a displacement plating layer, has a film hardness of Hmv 500 or more, is located at least inside the helical groove and on that sliding portion which opposes an Oldham's mechanism, and has a thickness within a range of 5 to 30 $\mu$m, said electroless plating layer having a film thickness deviation which is within ±20% of an average thickness.

11. A fluid compressor according to claim 9, wherein the electroless plating layer, which is located around the circumferential surface of the rotating member and formed mainly of nickel, is one of a one-layer structure or a two-layer structure, said electroless plating layer being formed of an alloy material which is one of Ni—P, Ni—B and Ni—P—B and which includes 80% of Ni by mass or more.

12. A fluid compressor according to claim 11, wherein an electroless plating coating is provided on the circumferential surface of the rotating member, said electroless plating coating employs said electroless plating layer as a matrix and includes one of: a plating layer in which rigid particles of SiN, SiC and BN is dispersed in an amount of 20% by mass or less; and a plating layer in which self-lubrication materials such as C, PTFE, mica and MoS2 are dispersed in an amount of 20% by mass or less.

13. A fluid compressor according to claim 11, wherein the electroless plating layer of the two-layer structure comprises a base plating layer formed of Ni—P and an upper plating layer which is formed continuously with the base plating layer and which is one of: a layer formed of an alloy material of either Ni—B or Ni—P—B; a layer in which rigid particles of SiN, SiC and EN are dispersed in an amount of 20% by mass or less; and a layer in which self-lubrication materials such as C, PTFE, mica, and $MoS_2$ are dispersed in an amount of 20% by mass or less.

14. A fluid compressor according to claim 11, wherein the electroless plating layer of the two-layer structure, which is provided around the circumferential surface of the rotating member, is formed such that a thickness ratio of the upper plating layer to the base plating layer is within a range.

* * * * *